(12) United States Patent
Qama et al.

(10) Patent No.: US 12,013,236 B2
(45) Date of Patent: Jun. 18, 2024

(54) METHOD FOR DETECTING A PHASE SHIFT IN AN OUTPUT OF AN INDUCTIVE POSITION SENSOR

(71) Applicant: Renesas Electronics America Inc., Milpitas, CA (US)

(72) Inventors: Gentjan Qama, Munich (DE); Harald Hartl, Graz-Strassgang (AT); Andreas Buchinger, Waldhofen/Ybbs (AT)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/872,269

(22) Filed: Jul. 25, 2022

(65) Prior Publication Data

US 2023/0034557 A1 Feb. 2, 2023

Related U.S. Application Data

(60) Provisional application No. 63/228,341, filed on Aug. 2, 2021.

(30) Foreign Application Priority Data

Jul. 18, 2022 (EP) .................................. 22185458

(51) Int. Cl.
*G01B 7/00* (2006.01)
*G01R 33/00* (2006.01)

(52) U.S. Cl.
CPC ......... *G01B 7/003* (2013.01); *G01R 33/0029* (2013.01)

(58) Field of Classification Search
CPC ........................... G01R 33/0029; G01B 7/003
See application file for complete search history.

(56) References Cited

U.S. PATENT DOCUMENTS

| 2009/0167296 | A1* | 7/2009 | Yokokawa | G01D 5/2449 324/207.25 |
| 2019/0212171 | A1* | 7/2019 | Anagnost | G01R 19/252 |
| 2020/0341447 | A1* | 10/2020 | Oshima | G05B 19/353 |

FOREIGN PATENT DOCUMENTS

CN 1720534 A * 1/2006 ............. G01C 19/56

OTHER PUBLICATIONS

Extended European Search Report dated Dec. 8, 2022 issued in EP 22185458.1.

* cited by examiner

*Primary Examiner* — Feba Pothen
(74) *Attorney, Agent, or Firm* — SCULLY, SCOTT, MURPHY & PRESSER, P.C.

(57) ABSTRACT

A method for detecting a phase shift in an output signal of an inductive position sensor by calculating the phase spectrum of the position signal based on a Fast Fourier Transformation of the position signal and comparing the calculated phase spectrums over time to detect changes in the phase spectrums.

10 Claims, 4 Drawing Sheets

METHOD FOR DETECTING A PHASE SHIFT IN AN OUTPUT OF AN INDUCTIVE POSITION SENSOR

CROSS-REFERENCE TO RELATED APPLICATIONS

The subject application claims priority to European Patent Application No. 22185458.1, filed on Jul. 18, 2022, and claims the benefit of U.S. Provisional Application No. 63/228,341, filed on Aug. 2, 2021. The entire disclosure of European Patent Application No. 22185458.1 and the entire disclosure of U.S. Provisional Application No. 63/228,341 are incorporated by this reference.

BACKGROUND

The invention relates to a method for detecting a phase shift in an output of an inductive position sensor, wherein the inductive position sensor provides a first position signal and a second phase-shifted position signal, particularly a sine position signal and a cosine position signal.

The invention further relates to an inductive position sensor implementing the method according to the invention.

In general, the invention relates to a method for detecting a phase shift in an output signal of an inductive position sensor by calculating the phase spectrum of the position signal based on a Fast Fourier Transformation of the position signal and comparing the calculated phase spectrums over time to detect changes in the phase spectrums.

Many applications need position feedback of a moving target like a rotating member, for example in a throttle control for motor bicycles. In most cases, an additional position sensor is mounted to the moving part to generate the required position information. From the prior art, magnetic position sensors and inductive position sensors are known. Since current carrying parts like motor cables or battery cables, a rotating motor package, the stator of the motor or additional equipment like a motor brake cause magnetic fields that may disturb magnetic fields, the use of inductive position sensors can provide robustness against such magnetic fields.

There are disclosed techniques listed below.
[Patent Document 1] U.S. Pat. No. 4,853,604
[Patent Document 2] US Patent Application Publication No. 2011/0101968
[Patent Document 3] U.S. Pat. No. 7,045,996
[Patent Document 4] U.S. Pat. No. 7,208,945
[Patent Document 5] US Patent Application Publication No. 2008/0116883

Inductive position sensors implement a magnet-free technology, utilizing the physical principles of eddy currents or inductive coupling to detect the position of a target that is moving above a set of coils, consisting for example of one transmitter coil and two receiver coils, particularly a sine receiver coil and a cosine receiver coil. Such an inductive sensor system is for example disclosed in Patent Document 1.

In a practical implementation of the three coils, one transmitter coil and two receiver coils, are typically provided as copper traces on a printed circuit board. They are arranged such that the transmitter coil induces a secondary voltage in the two receiver coils, which depends on the position of the conductive, e.g., metallic, target above the receiver coils. Therefore, the inductive sensor comprises or is connected to an oscillator that generates a radio-frequency signal, which is applied to the transmitter coil to create a static high frequency magnetic field. This static high frequency magnetic field is picked up by the receiver coils, particularly the sine receiver coil and the cosine receiver coil. Depending on the position of the conductive target above the coils, the secondary voltage picked up by the receiver coils is changing in amplitude, allowing the determination of the target's position by analysing this effect. For example, the target position is calculated by the arctangent of the momentary sine signal amplitude divided by the momentary cosine signal amplitude. The calculation is performed by a processing unit (embodied, for example, by a processor comprising hardware), which is connected to the position sensor or integral part of the position sensor.

In order to process the receiver signals, a complex circuit containing a demodulator, a gain stage, offset and gain mismatch compensation, an analog-to-digital converter and a digital signal processing unit (embodied, for example, by a processor comprising hardware) providing some form of arctangent calculation is necessary.

Patent Document 2 discloses an inductive position sensor for determining the position of a movable element. The position sensor comprises two subsystems, each having two transmitter, an LC resonant circuit on the movable element and a receiver coil with an evaluation unit. The processing of the individual subsystems is carried out alternatively. Thus, if one subsystem is operating, all other subsystems are deactivated. The movable element including the LC resonant circuit rotates within a total electromagnetic field generated by the overlap of the two electromagnetic fields of the two transmitter. In response, the LC resonant circuit will produce an electromagnetic field, which will be received by the receiver coil and the evaluation unit.

Patent Document 3 discloses a method for determining the position of a device including generating at least two, time-varying, magnetic fields using inductive elements, wherein the fields have different phases. The method further includes detecting a signal modulated on top of the fields, wherein the signal is generated from the device, and determining the position of the device based on a phase difference of the signal from the device and a reference signal. Like Patent Document 2, the disclosed method requires an LC resonant circuit on the moving device.

Patent Document 4 discloses a sensor comprising an excitation winding, a signal generator operable to generate an excitation signal and arranged to apply the generated excitation signal to the excitation winding, a sensor winding electromagnetically coupled to the excitation winding and a signal processor operable to process a periodic electric signal generated in the sensor winding when the excitation signal is applied to the excitation winding by the signal generator to determine a value of a sensed parameter. The excitation signal comprises a periodic carrier signal having a first frequency modulated by a periodic modulation signal having a second frequency, the first frequency being greater than the second frequency. In this way, the sensor is well suited to using digital processing techniques both to generate the excitation signal and to process the signal induced in the sensor windings. In an embodiment, the sensor is used to detect the relative position of two members. In other embodiments, the sensor is used to detect environmental factors such as temperature and humidity.

Patent Document 5 discloses an inductive sensor device and a method for inductive identification comprising a first exciter inductor and a second exciter inductor extending along a measurement range and vary spatially differently from each other. A first inductive coupling element and a second inductive coupling element couple a signal from the two exciter inductors into a receiver inductor. The inductive coupling elements are formed as resonance elements with a first resonance frequency f1 and a second resonance frequency f2. In order to be able to simply determine the position of both inductive coupling elements quickly and accurately, the two exciter inductors are driven by different transmission signals S1, S2. Each of the transmission signals S1, S2 includes signal components of a first carrier frequency near the first resonance frequency f1 varying in temporal progression, and of a second carrier frequency near the second resonance frequency f2 varying in temporal progression.

In an inductive linear position sensor, the receiver coils extend along a linear moving path of the conductive target and the conductive target has a certain linear extension. In an inductive arc position sensor, the receiver coils extend along an angular, particularly radial, moving path of the conductive target and the conductive target has a certain angular extension. In case the arc position sensor covers 360°, i.e., the moving target rotates completely around an axis, it is also referred to as inductive rotational position sensor.

Due to safety requirements of the systems using inductive position sensors, like in automotive applications as autonomous driving systems, it is necessary to implement error detection regarding the position signal of the inductive position sensor.

Errors in the position signal of an inductive position sensor result in a phase shift in the output signal of the inductive position sensor and in most cases relate to a target displacement or an electrical fault somewhere in the electronics of the inductive position sensor. Usually, the electronics of the inductive position sensor comprise certain safety mechanisms, so the main problem is to detect a target displacement. The target displacement can occur during the normal operation of the inductive position sensor or it can happen with the aging of the system including the inductive position sensor.

It is therefore an object to provide a method for detecting a phase shift in an output signal of an inductive position sensor resulting from an error in the position signal of an inductive position sensor caused by a target displacement and other error sources.

SUMMARY

A method is provided for detecting a phase shift in an output signal of an inductive position sensor, wherein the inductive position sensor provides a first position signal and a second phase-shifted position signal, particularly a sine position signal and a cosine position signal, the method comprising the steps of:
 sampling the first position signal and the second position signal over one period of the inductive position sensor with a sampling frequency if the first position signal and the second position signal are analog;
 calculating the Fast Fourier Transform of the first position signal and the second position signal over one period of the inductive position sensor, which results in a first position vector and a second position vector, the first position and the second position vector each comprising real components and imaginary components for each sample of the respective position signal;
 calculating the phase spectrum of the first position signal and the phase spectrum of the second position signal over one period of the inductive position sensor from the first position vector and the second position vector by determining the arctan function of the imaginary part divided by the real part for each member of the first position vector and the second position vector;
 repeating the steps of sampling the first position signal and the second position signal over one period of the inductive position sensor, calculating the Fast Fourier Transform of the first position signal and the second position signal over one period of the inductive position sensor and calculating the phase spectrum of the first position signal and the phase spectrum of the second position signal over one period of the inductive position sensor from the first position vector and the second position vector for further periods of the first position signal and the second position signal of the inductive position sensor,
 comparing the calculated phase spectrum of the first position signal and the phase spectrum of the second position signal of different periods of the first position signal and the second position signal of the inductive position sensor to detect a change in the phase spectrum of the first position signal and/or in the phase spectrum of the second position signal.

The method can be based on a processing of the first position signal and the second position signal. The processing requires sampled first position signal and second positions signal, so that in a first step the first position signal and the second position signal are sampled with a sampling frequency if the first position signal and the second position signal are analog. The sampling frequency can be higher than frequency of the first position signal and second position signal, particularly at least 10-times or at 100-times higher.

According to the method, the Fast Fourier Transform (FFT) of the first position signal and the second position signal is calculated over one period of the inductive position sensor. The Fast Fourier Transform is an algorithm that computes the discrete Fourier transform (DFT) of a sequence, i.e., the sampled first position signal and the sampled second position signal. Generally, a Fourier analysis converts a signal from its original domain, usually time or space, to a representation in the frequency domain and vice versa. The DFT is obtained by decomposing a sequence of values into components of different frequencies. The calculation of the Fast Fourier Transform of the first position signal and the second position signal over one period of the inductive position sensor results in a first position vector and a second position vector, wherein the first position vector and the second position vector each comprising real components and imaginary components for each sample of the respective position signal.

In the next step of the method, the phase spectrum of the first position signal and the phase spectrum of the second position signal over one period of the inductive position sensor are calculated from the first position vector and the second position vector respectively by determining the arctan function of the imaginary part divided by the real part for each member of the first position vector and the second position vector. The calculated phase spectrum of the first position signal and the calculated phase spectrum of the second position signal are kept for later reference, e.g., stored in a memory of the inductive position sensor.

Afterwards, the steps of sampling the first position signal and the second position signal over one period of the inductive position sensor, calculating the Fast Fourier Transform of the first position signal and the second position signal over one period of the inductive position sensor and calculating the phase spectrum of the first position signal and the phase spectrum of the second position signal over one period of the inductive position sensor from the first position vector and the second position vector are repeated for further periods of the first position signal and the second position signal of the inductive position sensor.

Finally, the calculated phase spectrum of the first position signal and the calculated phase spectrum of the second position signal of different periods of the first position signal and the second position signal of the inductive position sensor are compared with each other to detect a change in the phase spectrum of the first position signal and/or in the phase spectrum of the second position signal. Thereby it is possible to detect a phase shift in an output signal of an inductive position sensor resulting from an error in the position signal of an inductive position sensor caused by a target displacement and other error sources. In case a target displacement occurs, the calculated phase spectrum of the first position signal and/or the calculated phase spectrum of the second position signal change over time, which can be detected by the method. Particularly an aging causing a target displacement can be detected by comparing the phase spectrum of the first position signal and the second phase spectrum over multiple periods of the inductive position sensor.

The method can be implemented by digital signal processing and executed by the signal processing unit (embodied, for example, by a processor comprising hardware) of the inductive position sensor. The performed calculations like the Fast Fourier Transform and phase spectrum calculations are not complex and do not require extensive memory. Thus, the method can executed by the signal processing unit of common inductive position sensors, particularly in real time.

In a variant of the method, the initially calculated phase spectrum of the first position signal and the initially calculated phase spectrum of the second position signal are stored as first initial phase spectrum and second initial phase spectrum and all afterwards calculated phase spectrums for the first position signal and the second position signal are compared to the first initial phase spectrum respectively second initial phase spectrum. Thereby, an aging of the system using the inductive position sensor can be securely detected as the phase shift will continuously increase over time, until it reaches a pre-defined threshold, in which case for example a message like a warning will be generated.

According to a variant of the method, the step of calculating the phase spectrum of the first position signal and the phase spectrum of the second position signal over one period of the inductive position sensor from the first position vector and the second position vector further comprises the step of detecting the maximum value for the phase spectrum of the first position signal and maximum value for the phase spectrum of the second position signal.

Pursuant to a variant of the method, the maximum values for the phase spectrum of the first position signal and the maximum values of the phase spectrum of the second position signal of different periods of the first position signal and the second position signal of the inductive position sensor are compared to each other to detect a change in the phase spectrum of the first position signal and/or in the phase spectrum of the second position signal. Thus, in this variant the method focuses on the maximum values of the phase spectrums of the first position signal and second position signal, which reduces the computational effort.

In a variant, the method further comprises the steps of calculating the difference between the phase spectrum of the first position signal and the phase spectrum of the second position signal for different periods of the inductive position sensor and comparing the difference between the phase spectrum of the first position signal and the phase spectrum of the second position signal for different periods of the inductive position sensor. For each period of the first position signal and the second position signal of the inductive position sensor the difference between the phase spectrum of the first position signal and the phase spectrum of the second position signal is calculated. This is repeated for following periods of the first position signal and the second position signal of the inductive position sensor and the results are compared to the first or to all previously calculated differences between the phase spectrum of the first position signal and the phase spectrum of the second position signal. Thereby, errors relating to a phase shift between the first position signal and the second position channel, or generally between different channels of the inductive position sensor, can be detected.

According to a variant, the method comprises the step of issuing a warning to a system connected to the inductive position sensor if the phase spectrum of the first position signal and/or the phase spectrum of the second position signal and/or the difference between the phase spectrum of the first position signal and the phase spectrum of the second position signal for different periods of the first position signal and the second position signal of the inductive position sensor exceeds an error level. The error level is for example 0.1% full scale or 3° or 4° phase shift between the first position signal and the second position signal.

Pursuant to a variant, the method comprises the step of filtering the calculated phase spectrum of the first position signal and of the phase spectrum of the second position signal to filter out other harmonics relating to noise. The calculated phase spectrums are noisy due to the division calculations involved. A solution is achieved by defining a certain threshold and ignore all other components that come from the noise, i.e., filtering out harmonics related to noise.

In a variant, the method further comprises the steps of receiving an external reference signal for the first position signal and/or the second position signal defining the starting position of the respective the first position signal and/or the second position signal and comparing the calculated phase spectrum of the first position signal and/or the phase spectrum of the second position signal at the starting position with the received external reference signal for the first position signal and/or the second position signal. If the starting point of the first position signal and/or the second position signal is detected by an external reference like a mechanical switch, the calculated phase spectrum at this point should always be the same. For example, the phase of a first sine position signal should at the starting point always be 0°, while the phase of a second cosine position signal at the starting point should be 90°. Whenever this is no longer the case, the sensor performance degraded or there is an issue on the mechanics of the inductive position sensor, as for example a target displacement. According to a variant, the starting position of a sine position signal has a zero amplitude or 0° and the starting position of a cosine position has a maximum amplitude of the cosine position signal or 90°.

According to a variant, the method further comprises the step of storing a history, a gradient, a distribution and/or a trend of the calculated the phase spectrums of the first position signal and the phase spectrums of the second position signal over multiple periods of the inductive position sensor. Using the stored history, gradient, distribution and/or trend of the calculated the phase spectrums of the first position signal and the phase spectrums of the second position signal over multiple periods the behavior of the inductive position sensor can be further analyzed for example it can be predicted based on this behavior how the inductive position sensor will behave in the future.

The object is further solved by a system, as shown in FIG. 4, including an inductive position sensor providing a first position signal and a second phase-shifted position signal, particularly a sine position signal and a cosine position signal, and a processing unit (embodied, for example, by a processor comprising hardware) implementing the method.

According to the method, the conductive target can be any kind of metal, such as aluminium, steel or a printed circuit board with a printed copper layer. Usually, an inductive position sensor comprises a metallic target.

BRIEF DESCRIPTION OF THE DRAWINGS

In the following, the invention will be further explained with respect to the embodiments shown in the figures. It shows.

DETAILED DESCRIPTION

Figure 1:
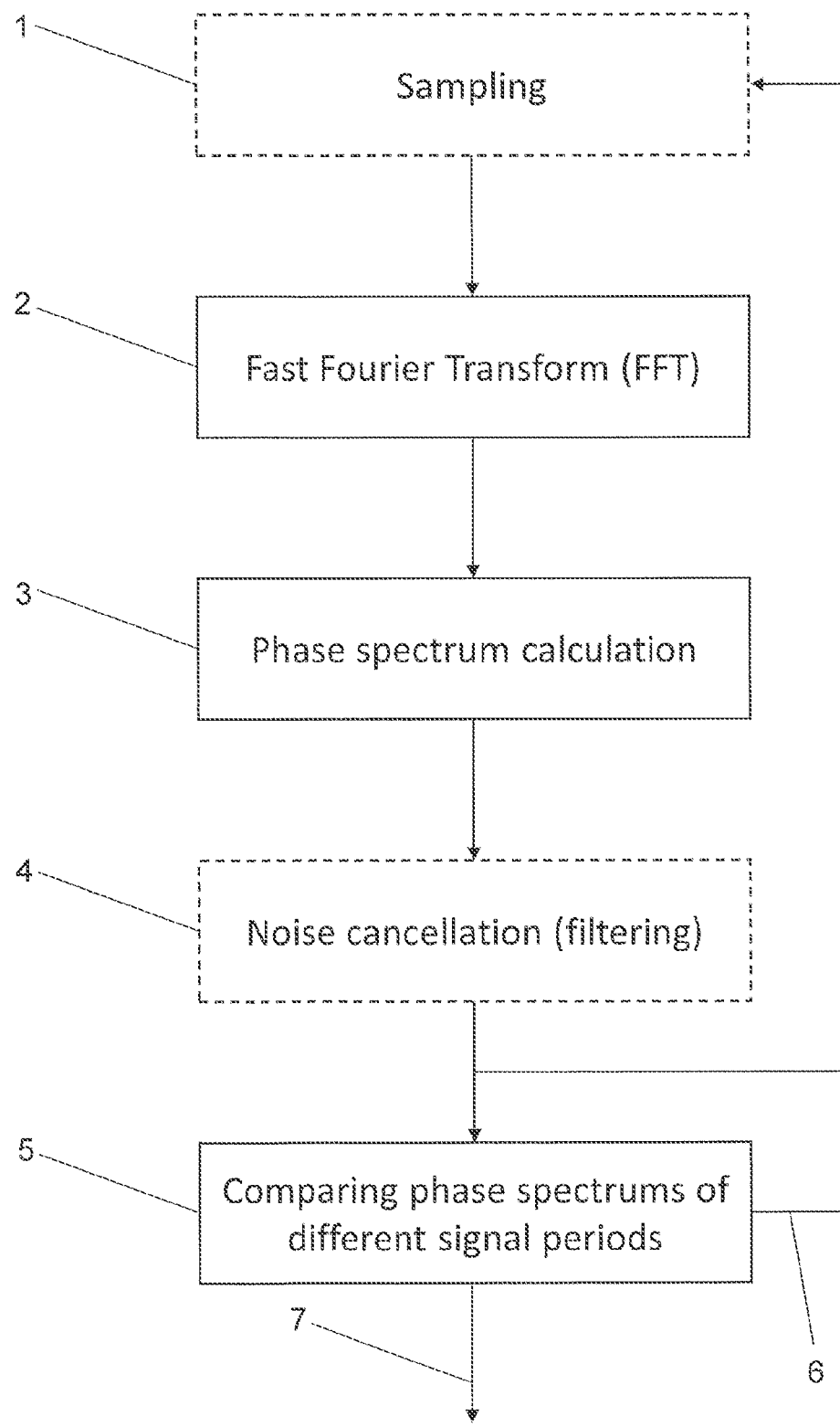
FIG. 1 a flow diagram of a method for detecting a phase shift in an output signal of an inductive position sensor according to a first embodiment, FIG. 2 a flow diagram of a method for detecting a phase shift in an output signal of an inductive position sensor according to a second embodiment, FIG. 3 a flow diagram of a method for detecting a phase shift in an output signal of an inductive position sensor according to a third embodiment, and FIG. 4 an inductive position sensor and a processor according to another embodiment.

FIG. 1 shows a flow diagram of a method for detecting a phase shift in an output signal of an inductive position sensor according to a first embodiment. The inductive position sensor provides a first position signal and a second phase-shifted position signal, particularly a sine position signal and a cosine position signal.

In a first optional step of the method, the first position signal and the second position signal are sampled 1 over one period of the inductive position sensor with a sampling frequency. Since this step is optional, it is shown in Fig. FIG. 1 in a dashed box. This step can be omitted if the inductive position sensor provides a series of discrete values, i.e., a sampled first positions signals and second position signals. If the first position signal and the second position signal are analog, the sampling 1 step is necessary.

According to the method, the Fast Fourier Transform (FFT) is calculated 2 of the first (sampled) position signal and the second (sampled) position signal over one period of the inductive position sensor. This calculation 2 of the FFT results in a first position vector comprising real components and imaginary components for each sample of the first (sampled) position signal and in a second position vector comprising real components and imaginary components for each sample of the second (sampled) position signal.

In the next step the phase spectrum of the first position signal is calculated 3 over one period of the inductive position sensor from the first position vector by determining the arctan function of the imaginary part divided by the real part for each member of the first position vector. Accordingly, the phase spectrum of the second position signal is calculated 3 over one period of the inductive position sensor from the second position vector by determining the arctan function of the imaginary part divided by the real part for each member of the second position vector.

A further optional step of the method comprises the filtering 4 of the calculated phase spectrum of the first position signal and of the phase spectrum of the second position signal to filter out other harmonics relating to noise.

Pursuant to a variant of the method, the initially calculated 3 phase spectrum of the first position signal and the initially calculated 3 phase spectrum of the second position signal are stored as first initial phase spectrum and second initial phase spectrum.

After the initial calculation 3 of the phase spectrum of the first position signal and the phase spectrum of the second position signal over one period of the position signal of the inductive position sensor, the method repeats the previous steps for future periods of the position signal of the inductive position sensor.

Regarding all following periods of the position signal of the inductive position sensor the method comprises the step of comparing 5 the calculated 3 phase spectrum of the first position signal and the phase spectrum of the second position signal of different periods of the first position signal and the second position signal of the inductive position sensor to detect a change in the phase spectrum of the first position signal and/or in the phase spectrum of the second position signal.

The method issues 7 a warning to a system connected to the inductive position sensor if the phase spectrum of the first position signal and/or the phase spectrum of the second position signal for different periods of the first position signal and the second position signal of the inductive position sensor exceeds an error level.

Figure 2:
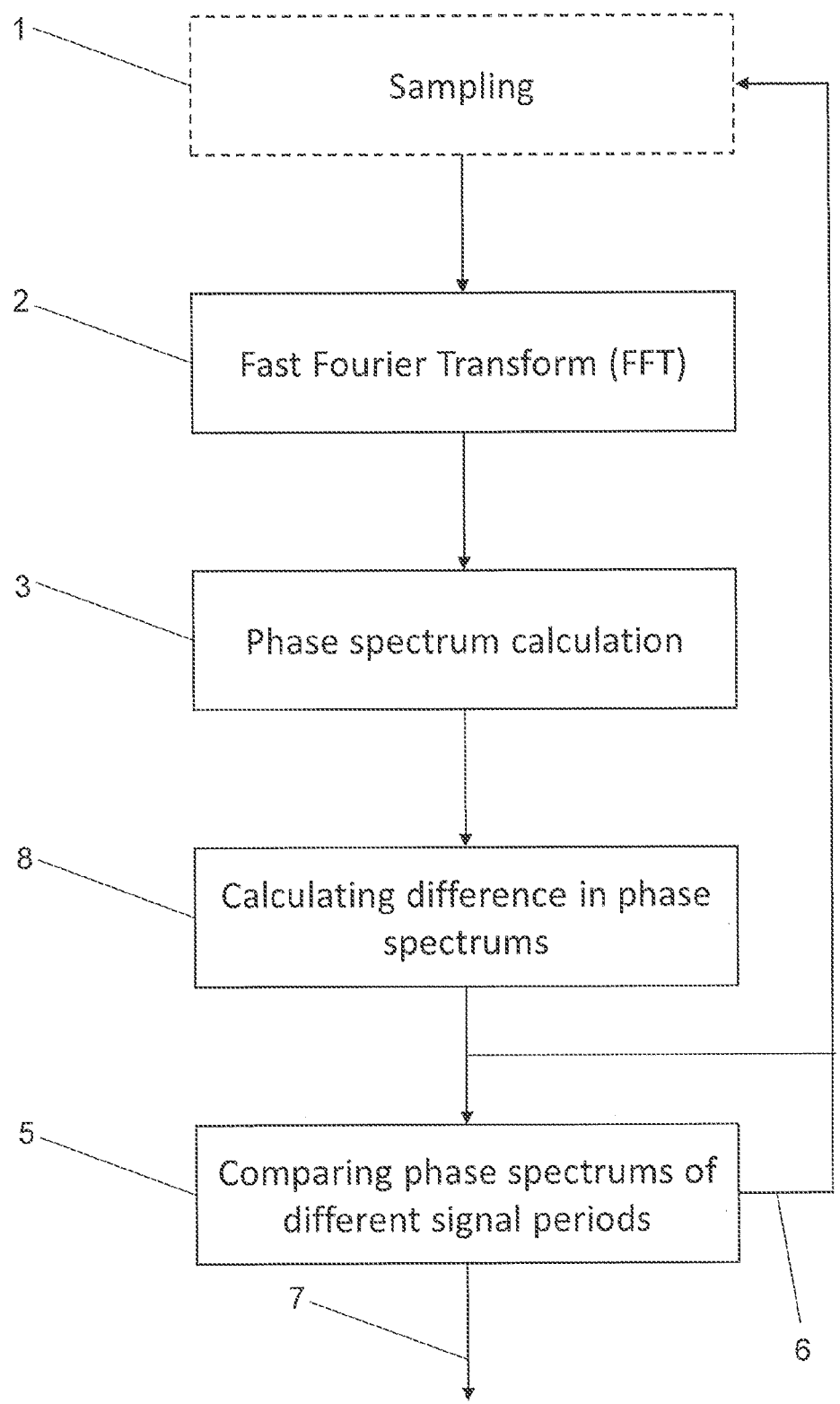

FIG. 2 shows a flow diagram of a method for detecting a phase shift in an output signal of an inductive position sensor according to a second embodiment. According to the second embodiment shown in FIG. 2 the method comprises the further step of calculating 8 the difference between the phase spectrum of the first position signal and the phase spectrum of the second position signal for different periods of the inductive position sensor and comparing 5 the difference between the phase spectrum of the first position signal and the phase spectrum of the second position signal for different periods of the inductive position sensor. Thus, in this variant additionally a phase shift between the first position signal and the second position signal can be detected. Particularly, a warning can be issued 7 to a system connected to the inductive position sensor if the difference between the phase spectrum of the first position signal and the phase spectrum of the second position signal for different periods of the first position signal and the second position signal of the inductive position sensor exceeds an error level.

In FIG. 2 the optional step of filtering 4 is omitted for clarity purposes only. The filtering 4 can also be used in the second embodiment shown in FIG. 2.

Figure 3:
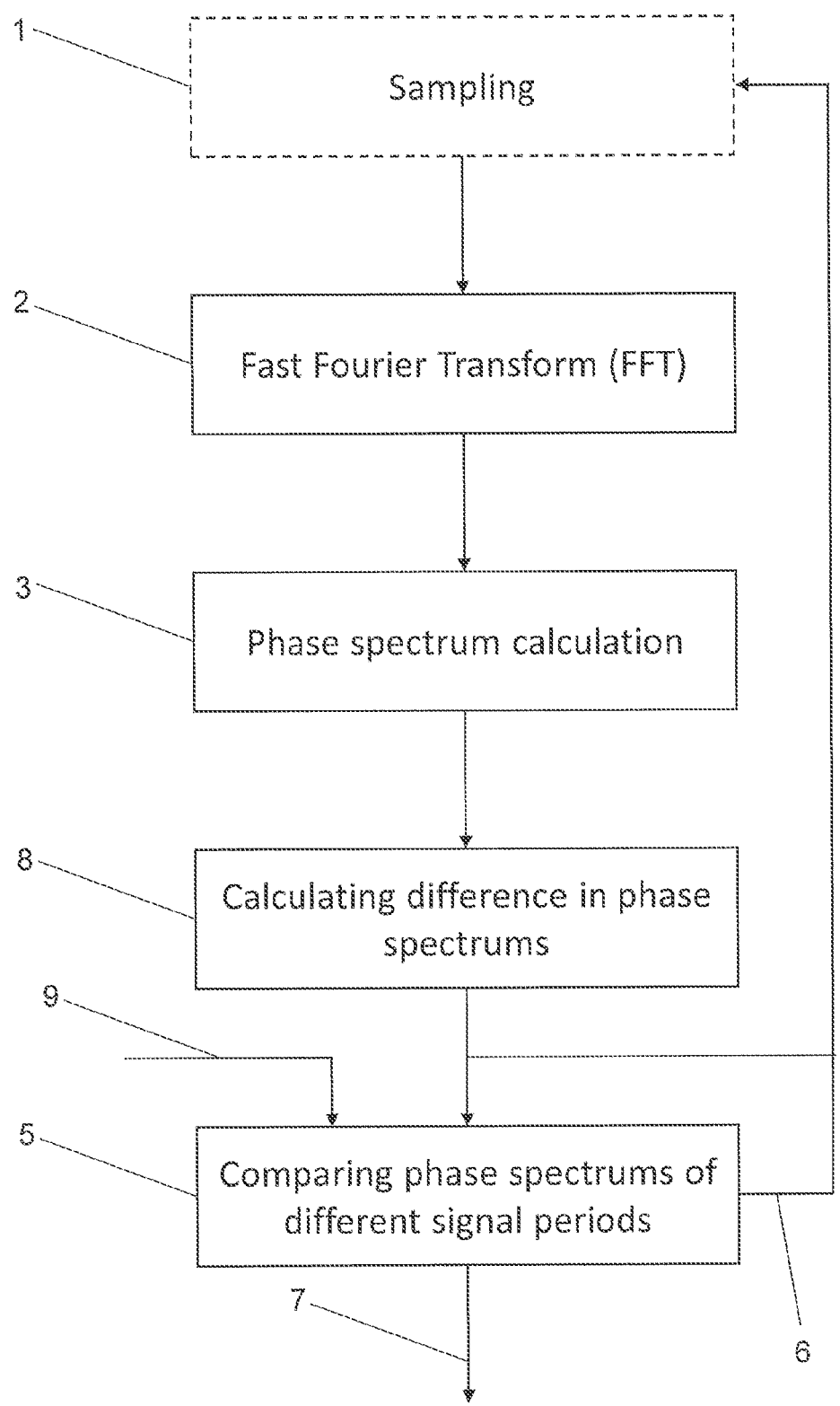
Figure 4:
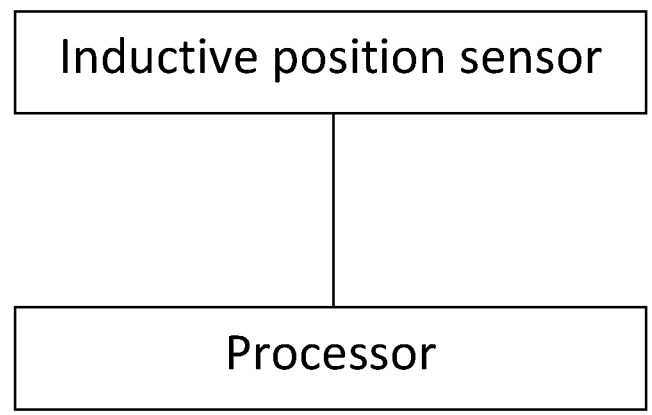

FIG. 3 shows a flow diagram of a method for detecting a phase shift in an output signal of an inductive position sensor according to a third embodiment. The method shown in FIG. 3 is based on the method shown in FIG. 2 but could also be based on the method shown in FIG. 1.

The method comprises the step of receiving 9 an external reference signal for the first position signal and/or the second position signal defining the starting position of the respective the first position signal and/or the second position signal. Afterwards, the calculated 3 phase spectrum of the first position signal and/or the phase spectrum of the second position signal at the starting position can be compared with the received 9 external reference signal for the first position signal and/or the second position signal. For example, the starting position of a sine position signal has a zero amplitude or 0° and the starting position of a cosine position has a maximum amplitude of the cosine position signal or 90°. If the calculated 3 phase spectrum of the first position signal and/or the phase spectrum of the second position signal at the starting position differ from these values by a pre-defined error level, a warning message can be issued 7.

For all disclosed embodiments, the step of calculating 3 the phase spectrum of the first position signal and the phase spectrum of the second position signal over one period of the inductive position sensor from the first position vector and the second position vector can further comprise the step of detecting the maximum value for the phase spectrum of the first position signal and maximum value for the phase spectrum of the second position signal. The maximum values of the phase spectrum of the second position signal of different periods of the first position signal and the second position signal of the inductive position sensor are compared 5 to each other to detect a change in the phase spectrum of the first position signal and/or in the phase spectrum of the second position signal. Thus, only the maximum values of the phase spectrums of the first position signal and second position signal are compared to each other and not all calculated 3 values of the phase spectrums of the first position signal and second position signal, which reduces the computational complexity.

What is claimed is:

1. A method for detecting a phase shift in an output signal of an inductive position sensor, wherein the inductive position sensor provides a first position signal and a second phase-shifted position signal, including a sine position signal and a cosine position signal, the method comprising:
    sampling the first position signal and the second position signal over one period of the inductive position sensor with a sampling frequency;
    calculating a Fast Fourier Transform of the first position signal and the second position signal over one period of the inductive position sensor, which results in a first position vector and a second position vector, the first position vector and the second position vector each comprising real components and imaginary components for each sample of the respective position signal;
    calculating a phase spectrum of the first position signal and a phase spectrum of the second position signal over one period of the inductive position sensor from the first position vector and the second position vector by determining an arctan function of the imaginary component divided by the real component for each sample of the first position vector and the second position vector;
    repeating the sampling the first position signal and the second position signal over one period of the inductive position sensor, the calculating the Fast Fourier Transform of the first position signal and the second position signal over one period of the inductive position sensor and the calculating the phase spectrum of the first position signal and the phase spectrum of the second position signal over one period of the inductive position sensor from the first position vector and the second position vector for further periods of the first position signal and the second position signal of the inductive position sensor;
    comparing the calculated phase spectrum of the first position signal and the phase spectrum of the second position signal of different periods of the first position signal and the second position signal of the inductive position sensor to detect a change in the phase spectrum of the first position signal and/or in the phase spectrum of the second position signal;
    determining that the phase spectrum of the first position signal and/or the phase spectrum of the second position signal and/or a difference between the phase spectrum of the first position signal and the phase spectrum of the second position signal for different periods of the first position signal and the second position signal of the inductive position sensor exceeds an error level; and
    issuing a warning to a system connected to the inductive position sensor in response to determining that the phase spectrum of the first position signal and/or the phase spectrum of the second position signal and/or the difference between the phase spectrum of the first position signal and the phase spectrum of the second position signal for different periods of the first position signal and the second position signal of the inductive position sensor exceeds the error level.

2. The method according to claim 1, wherein an initially calculated phase spectrum of the first position signal and an initially calculated phase spectrum of the second position signal are stored as a first initial phase spectrum and a second initial phase spectrum and all afterwards calculated phase spectrums for the first position signal and the second position signal are compared to the first initial phase spectrum and the second initial phase spectrum.

3. The method according to claim 1, wherein calculating the phase spectrum of the first position signal and the phase spectrum of the second position signal over one period of the inductive position sensor from the first position vector and the second position vector further comprises detecting a maximum value for the phase spectrum of the first position signal and a maximum value for the phase spectrum of the second position signal.

4. The method according to claim 3, wherein the maximum values for the phase spectrum of the first position signal and the maximum values of the phase spectrum of the second position signal of different periods of the first position signal and the second position signal of the inductive position sensor are compared to each other to detect the change in the phase spectrum of the first position signal and/or in the phase spectrum of the second position signal.

5. The method according to claim 1, further comprising:
    calculating a difference between the phase spectrum of the first position signal and the phase spectrum of the second position signal for different periods of the inductive position sensor; and
    comparing the difference between the phase spectrum of the first position signal and the phase spectrum of the second position signal for different periods of the inductive position sensor.

6. The method according to claim 1, further comprising filtering the calculated phase spectrum of the first position signal and the phase spectrum of the second position signal to filter out other harmonics relating to noise.

7. The method according to claim 1, further comprising:
    receiving an external reference signal for the first position signal and/or the second position signal defining a starting position of the respective the first position signal and/or the second position signal; and
    comparing the calculated phase spectrum of the first position signal and/or the phase spectrum of the second position signal at the starting position with the received external reference signal for the first position signal and/or the second position signal.

8. The method according to claim 7, wherein the starting position of the sine position signal has a zero amplitude or 0° and the starting position of the cosine position signal has a maximum amplitude of the cosine position signal or 90°.

9. The method according to claim 1, further comprising storing a history, a gradient, a distribution and/or a trend of the calculated the phase spectrums of the first position signal and the phase spectrums of the second position signal over multiple periods of the inductive position sensor.

10. A device for detecting a phase shift in an output signal of an inductive position sensor, wherein the inductive position sensor provides a first position signal and a second phase-shifted position signal, including a sine position signal and a cosine position signal, wherein the system comprises:
a processor configured to:
sample the first position signal and the second position signal over one period of the inductive position sensor with a sampling frequency;
calculate a Fast Fourier Transform of the first position signal and the second position signal over one period of the inductive position sensor, which results in a first position vector and a second position vector, the first position vector and the second position vector each comprising real components and imaginary components for each sample of the respective position signal;
calculate a phase spectrum of the first position signal and a phase spectrum of the second position signal over one period of the inductive position sensor from the first position vector and the second position vector by determining an arctan function of the imaginary component divided by the real component for each sample of the first position vector and the second position vector;
repeat the sampling the first position signal and the second position signal over one period of the inductive position sensor, the calculating the Fast Fourier Transform of the first position signal and the second position signal over one period of the inductive position sensor and the calculating the phase spectrum of the first position signal and the phase spectrum of the second position signal over one period of the inductive position sensor from the first position vector and the second position vector for further periods of the first position signal and the second position signal of the inductive position sensor;
compare the calculated phase spectrum of the first position signal and the phase spectrum of the second position signal of different periods of the first position signal and the second position signal of the inductive position sensor to detect a change in the phase spectrum of the first position signal and/or in the phase spectrum of the second position signal; and
issue a warning to a system connected to the inductive position sensor if the phase spectrum of the first position signal and/or the phase spectrum of the second position signal and/or a difference between the phase spectrum of the first position signal and the phase spectrum of the second position signal for different periods of the first position signal and the second position signal of the inductive position sensor exceeds an error level.

* * * * *